(12) United States Patent
Jain et al.

(10) Patent No.: US 11,984,503 B2
(45) Date of Patent: May 14, 2024

(54) HIGH-VOLTAGE DEVICES INTEGRATED ON SEMICONDUCTOR-ON-INSULATOR SUBSTRATE

(71) Applicant: GlobalFoundries Dresden Module One Limited Liability Company & Co. KG, Dresden (DE)

(72) Inventors: Ruchil Kumar Jain, Dresden (DE); Alban Zaka, Dresden (DE)

(73) Assignee: GlobalFoundries Dresden Module One LLC &Co. KG, Dresden (DE)

( * ) Notice: Subject to any disclaimer, the term of this patent is extended or adjusted under 35 U.S.C. 154(b) by 0 days.

(21) Appl. No.: 18/052,205

(22) Filed: Nov. 3, 2022

(65) Prior Publication Data

US 2023/0115000 A1    Apr. 13, 2023

Related U.S. Application Data

(63) Continuation of application No. 16/876,098, filed on May 17, 2020, now Pat. No. 11,552,192.

(51) Int. Cl.
*H01L 29/78* (2006.01)
*H01L 21/762* (2006.01)
*H01L 29/66* (2006.01)

(52) U.S. Cl.
CPC .... *H01L 29/7824* (2013.01); *H01L 21/76224* (2013.01); *H01L 29/66681* (2013.01)

(58) Field of Classification Search
CPC .............. H01L 27/1207; H01L 29/66681
See application file for complete search history.

(56) References Cited

U.S. PATENT DOCUMENTS

| | | | |
|---|---|---|---|
| 10,211,336 B2 | 2/2019 | Zhu et al. | |
| 11,552,192 B2* | 1/2023 | Jain | .......... H01L 21/76283 |
| 2017/0040422 A1* | 2/2017 | Jung | .......... H01L 28/00 |
| 2018/0122942 A1 | 5/2018 | Ponoth et al. | |
| 2019/0157451 A1 | 5/2019 | Cortes Mayol et al. | |
| 2019/0386134 A1* | 12/2019 | Kim | .......... H01L 29/7835 |
| 2020/0343368 A1* | 10/2020 | Dinh | .......... H01L 21/823814 |
| 2021/0210630 A1 | 8/2021 | Li et al. | |

OTHER PUBLICATIONS

Santosh Sharma et al., Planar Dual Gate Oxide LDMOS Structures in 180nm Power Management Technology, 24th International Symposium on Power Semiconductor Devices and ICs, 2012, pp. 405-408, IEEE.

* cited by examiner

*Primary Examiner* — Raj R Gupta
(74) *Attorney, Agent, or Firm* — Anthony Canale (57) ABSTRACT

The present disclosure generally to semiconductor devices, and more particularly to semiconductor devices having high-voltage transistors integrated on a semiconductor-on-insulator substrate and methods of forming the same. The present disclosure provides a semiconductor device including a bulk substrate having an upper surface, a semiconductor layer above the bulk substrate, an insulating layer between the semiconductor layer and the bulk substrate, a source region and a drain region on the bulk substrate, the source region and the drain region are raised above the upper surface of the bulk substrate, in which the source region and the drain region include an epitaxial semiconductor material, a gate dielectric between the source region and the drain region, the gate dielectric having a first portion on the bulk substrate and a second portion on the semiconductor layer, and a gate electrode above the gate dielectric.

15 Claims, 9 Drawing Sheets

HIGH-VOLTAGE DEVICES INTEGRATED ON SEMICONDUCTOR-ON-INSULATOR SUBSTRATE

FIELD OF THE INVENTION

The disclosed subject matter relates generally to semiconductor devices, and more particularly to semiconductor devices having high-voltage transistors integrated on a semiconductor-on-insulator substrate and methods of forming the same.

BACKGROUND

Integrated circuit (IC) chip integration requires the formation of many different types of semiconductor devices on the same chip to enable various features offered by the integrated semiconductor devices. Many such IC chips employ semiconductor devices for power applications that are subjected to high voltages as well as high-performance semiconductor devices that employ typical low supply voltages. For example, a high voltage power amplifier/switch may be employed in an IC chip to provide a high voltage output. Likewise, a high voltage rectifier in an IC chip may enable a low voltage power supply network from a high voltage power supply connected to the IC chip.

Semiconductor-on-insulator (SOI) substrates, such as fully depleted SOI (FDSOI), or partially depleted SOI (PDSOI) are used for various IC applications. SOI substrates may include a layer of semiconductor material located above a bulk substrate. The thin layer of semiconductor material may be separated from the bulk substrate by a buried oxide (BOX) layer. Typically, IC applications, such as radio frequency or power management, may include high voltage (HV) transistors. However, the layer of semiconductor material in SOI substrates is not amenable to accommodate HV transistors. This results in difficulties in integrating HV transistors on SOI substrates. For example, conventional techniques for integrated HV transistors on SOI substrates require complex processing which may incur higher cost. Furthermore, it is found that HV devices built using conventional techniques are unable to sustain high voltage operations (e.g., a higher likelihood of an eventual breakdown of the transistors).

With the industry's drive for higher density, higher performance, higher power, lower-cost devices, and the implementation of nanometer-scale process nodes, there is a need to provide semiconductor devices that can overcome, or at least ameliorate, one or more of the disadvantages as described above.

SUMMARY

In an aspect of the present disclosure, there is provided a semiconductor device including a bulk substrate having an upper surface, a semiconductor layer above the bulk substrate, an insulating layer between the semiconductor layer and the bulk substrate, a source region and a drain region on the bulk substrate, the source region and the drain region are raised above the upper surface of the bulk substrate, in which the source region and the drain region include an epitaxial semiconductor material, a gate dielectric between the source region and the drain region, the gate dielectric having a first portion on the bulk substrate and a second portion on the semiconductor layer, and a gate electrode above the gate dielectric.

In another aspect of the present disclosure, there is provided a semiconductor device including a bulk substrate, a semiconductor layer above the bulk substrate, an insulating layer between the semiconductor layer and the bulk substrate, a source region and a drain region on the bulk substrate, a gate having a drain-facing sidewall, the gate includes a gate electrode above a gate dielectric, the gate dielectric is between the source region and the drain region, the gate dielectric having a first portion on the bulk substrate and a second portion on the semiconductor layer, a gate spacer directly on the drain-facing sidewall of the gate, a drift well in the bulk substrate, a drain extension region in the drift well, the drain extension region is located between the drain region and the gate electrode, in which the insulating layer and the semiconductor layer extend laterally to cover the drain extension region, and a nitride layer on the gate spacer, the nitride layer is directly on the semiconductor layer.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

Various illustrative embodiments of the present disclosure are described below. The embodiments disclosed herein are exemplary and not intended to be exhaustive or limiting to the present disclosure.

Figure 1A:
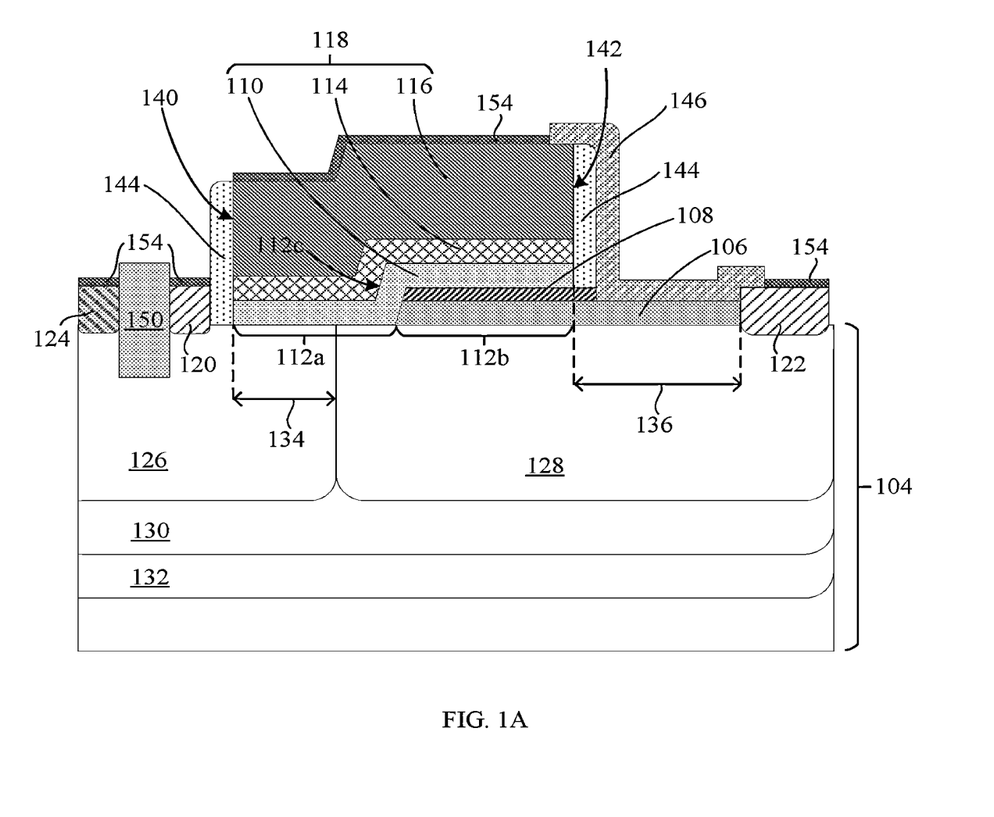
FIGS. 1A to 1D are cross-sectional views of various embodiments of a semiconductor device, in accordance with the present disclosure.

Referring to FIG. 1A, a cross-sectional view of an exemplary semiconductor device is shown. The device may include a semiconductor layer 108, a bulk substrate 104, and an insulating layer 106. The insulating layer 106 is between the semiconductor layer 108 and the bulk substrate 104.

The semiconductor layer 108 and the bulk substrate 104 may be made of any semiconductor material, such as silicon, germanium, silicon germanium (SiGe), silicon carbide, and those consisting essentially of III-V compound semiconductors, such as GaAs, II-VI compound semiconductors such as ZnSe. The semiconductor layer 108 and the bulk substrate 104 may be amorphous, polycrystalline, or monocrystalline.

The bulk substrate 104 may include various doped regions and doped wells. The doped regions and doped wells in the bulk substrate 104 may have various dopant conductivity types, such as P-type and N-type, as well as various depths and dopant concentrations. Exemplary dopants for N-type conductivity doping may include, but not limited to, arsenic, phosphorus, or antimony. Exemplary dopants for P-type conductivity doping may include, but not limited to, boron, aluminum, or gallium. The dopant concentrations, for example, may depend on the technology node and design requirements.

As shown, the bulk substrate 104 may have a body well 126 and an adjacent drift well 128. The body well 126 may abut the drift well 128. Alternatively, the body well 126 may be spaced apart from the drift well 128. In the embodiment shown in FIG. 1A, an edge of the body well 126 abuts an edge of the drift well 128 at a location below the gate 118. The bulk substrate 104 may also include deep isolation wells 130, 132 disposed below the body well 126 and the drift well 128. The deep isolation wells 130, 132 may function to electrically isolate the body well 126 and drift well 128 from other doped regions in the bulk substrate 104.

The semiconductor layer 108 and the insulating layer 106 may be positioned above the drift well 128, and may not extend to cover the body well 126. The semiconductor layer 108 may be a fully depleted or partially depleted semiconductor layer 108. The insulating layer 106 may function as an electrical isolation layer between the semiconductor layer 108 and the bulk substrate 104. In some embodiments, the insulating layer 106 may include an oxide material (e.g., silicon dioxide) and may be formed by oxidation of a semiconductor material.

The device may also include a source region 120 and a drain region 122 disposed on the bulk substrate 104. In some embodiments, the source region 120 and drain region 122 may be raised above an upper surface of the bulk substrate 104. Additionally, a gate 118 may be disposed between the source region 120 and drain region 122. The gate 118 may have a source-facing sidewall 140 and a drain-facing sidewall 142. As used herein, the term "drain-facing" sidewall may refer to a sidewall of the gate 118 that faces the drain region 122. Likewise, the term "source-facing" sidewall may refer to a sidewall of the gate 118 that faces the source region 120.

The gate 118 includes a gate dielectric 110 and a gate electrode 116 arranged above the gate dielectric 110. A work-function material (WFM) layer 114 may be disposed between the gate dielectric 110 and the gate electrode 116. Alternatively, in some embodiments (not shown), more than one WFM layers may be disposed between the gate dielectric 110 and the gate electrode 116, depending on design requirements. Gate spacers 144 may be formed on the source-facing sidewall 140 and the drain-facing sidewall 142 and may provide electrical insulation to prevent electrical shorts between the gate electrode 116 and the adjacent source 120 and drain 122 regions.

The gate 118 may partially overlap both the drift well 128 and the body well 126. In particular, the gate dielectric 110 may have a first portion 112a disposed on the bulk substrate 104 and a second portion 112b disposed on the semiconductor layer 108. Additionally, the first portion 112a of the gate dielectric 110 may be positioned above the body well 126 and the second portion 112b of the gate dielectric 110 may be positioned above the drift well 128. The first portion 112a and the second portion 112b are contiguous with each other. Due to the semiconductor layer 108 being at a higher elevation than the bulk substrate 104, the first portion 112a of the gate dielectric 110 may transition to the second portion 112b of the gate dielectric 110 through a "step transition", or an edge 112c. As shown, the edge 112c may be substantially vertical, sloped, or inclined to an upper surface of the bulk substrate 104.

The gate dielectric 110 may include silicon dioxide ($SiO_2$), a high-k dielectric material, silicon oxynitride, other suitable materials, or combinations thereof. The high-k dielectric material may have a dielectric constant (i.e., K value) that is greater than 5, preferably between 20 to 30. Examples of the high-k dielectric material may include, but not limited to, metal oxides, metal nitrides, metal silicates, transition metal oxides, transition metal nitrides, transition metal silicates, oxynitrides of metals, metal aluminates, hafnium oxide ($HfO_2$), zirconium oxide ($ZrO_2$), lanthanum oxide ($La_2O_3$), aluminum oxide ($Al_2O_3$), titanium oxide ($TiO_2$), strontium titanium oxide ($SrTiO_3$), lanthanum aluminum oxide ($LaAlO_3$), yttrium oxide ($Y_2O_3$), zirconium silicate, zirconium aluminate, or combinations thereof. The gate dielectric 110 may have a single layer structure. Alternatively (not shown), the gate dielectric 110 may have a multilayer structure such as a layer of silicon dioxide arranged upon another layer of high-k dielectric material.

The gate electrode 116 may be made of an electrically conductive material such as, but not limited to, highly doped polysilicon, tungsten, cobalt, nickel, copper, and aluminum. The WFM layer 114 may include any metallic compound or a composition of metallic compounds capable of modifying the work function property of a gate. Examples of metallic compounds may include, but not limited to, Hf, Ti, Zr, Cd, La, Tl, Yb, Al, Ce, Eu, Li, Pb, Tb, Bi, In, Lu, Nb, Sm, V, Zr, Ga, Mg, Gd, Y, TiAl, TaN, Pt, Rh, Ir, Ru, Cu, Os, Be, Co, Pd, Te, Cr, Ni, a stack thereof, a conductive oxide thereof, a conductive nitride thereof, an alloy thereof, and a combination thereof.

The drain region 122 may be disposed upon an upper surface of the drift well 128. The drift well 128 may include a drift extension region 136. The drain extension region 136 may function as an extension from the drain region 122 and may be located between the drain region 122 and the gate electrode 116. The size of the drift extension region 136 may correspond to a distance between an edge of the drain region 122 and the drain-facing sidewall 142 of the gate 118, and may vary depending on the design requirements of the device.

As shown in FIG. 1A, the insulating layer 106 may extend laterally to cover the drain extension region 136. A nitride layer 146 may be formed on the gate spacer 144 and extends to cover the extended portion of the insulating layer 106. Alternatively, as will be shown in subsequent drawings, both the insulating layer 106 and the semiconductor layer 108 may extend laterally to cover the drain extension region 136.

A body region 124 and the source region 120 may be disposed upon an upper surface of the body well 126. The body region 124 may be isolated from the source region 120 by an isolation structure 150. The isolation structure 150 may be made of a dielectric material, e.g., oxides such as silicon dioxide ($SiO_2$), tetraethyl orthosilicate (TEOS). The isolation structure 150 may be a shallow trench isolation region as shown in FIG. 1A, but alternatively a deep trench isolation region could be used.

As shown, the overlapping region between the gate 118 and the body well 126 may be defined as a channel region 134. The size of the channel region 134 may correspond to a distance between the source-facing sidewall 140 of the gate 118 and an edge of the body well 126. The size of the channel region 134 may vary depending on the design requirement of the device. The drift well 128 provides an electrical pathway for the diffusion of charges between the drain region 122 and the channel region 134, while the body well 126 provides an electrical pathway for the diffusion of charges between the source region 120, the body region 124 and the channel region 134.

The body well 126 and the drift well 128 may have opposite conductivity types with respect to each other. For example, the body well 126 may have a P-type conductivity, whereas the drift well 128 may have an N-type conductivity, or vice versa. The drift well 128 may have the same conductivity type as that of the drain region 122 and the source region 120.

The body region 124 may be raised above the upper surface of the bulk substrate 104 and may be coupled to a bias voltage. The body region 124 may have the same conductivity type as the body well 126. The body region 124 may also have a dopant concentration that is higher than the dopant concentration of the body well 126.

A silicide layer 154 may be formed upon upper surfaces of the gate electrode 116, the body region 124, the source region 120, and the drain region 112. Although not shown in the accompanying drawings, interconnect features may be formed on the silicide layers 154 to provide electrical connections with other IC components (not shown).

Figure 1B:
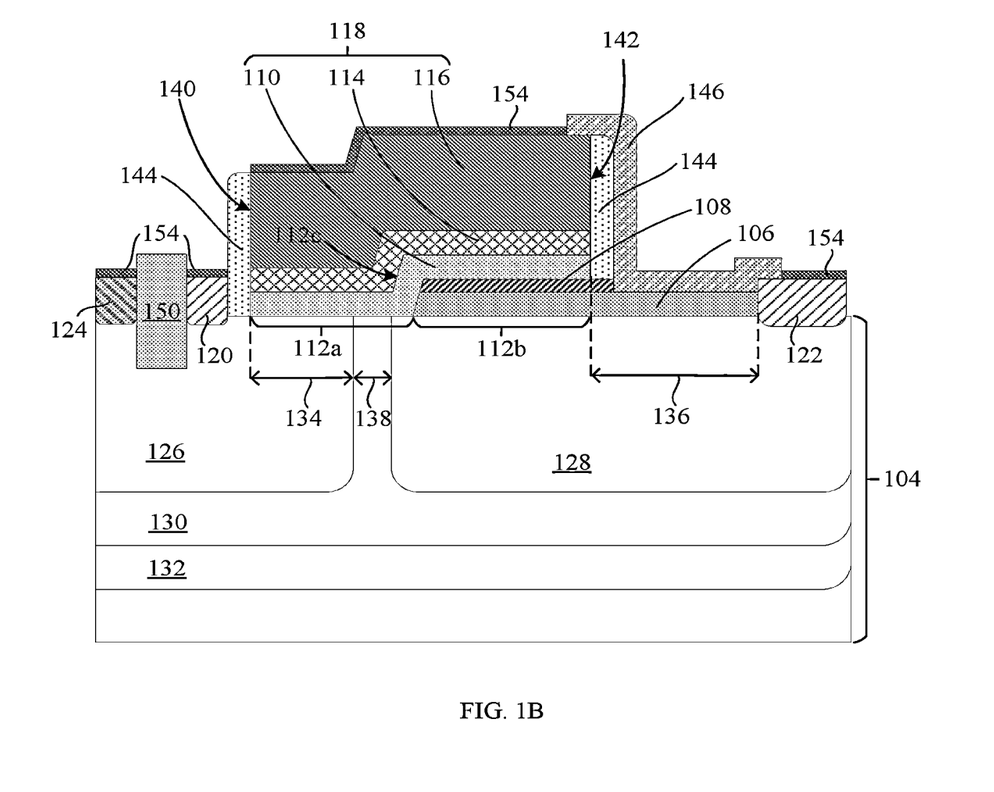

Referring to FIG. 1B, a cross-sectional view of another exemplary semiconductor device is shown. The embodiment shown in FIG. 1B is similar to the embodiment shown in FIG. 1A except that in FIG. 1B, the body well 126 is spaced apart from the drift well 128 by a gap spacing 138 in the bulk substrate 104. The gap spacing 138 in the bulk substrate 104 may be bounded by the edges of the adjacent body well 126 and drift well 128 and the underlying deep isolation well 130. The gap spacing 138 may be substantially free of extrinsic doping atoms but may still contain charge carriers provided by other doped portions of the structure. The gap spacing 138 between the body well 126 and the drift well 128 may serve to widen the depletion region of the PN junction between the body well 126 and the drift well 128 and reduces the surface electric field stress below the first portion 112a of the gate dielectric 110, thereby reducing the electrical field. It should be understood that the above-mentioned implementations of FIG. 1B are contemplated as being applicable to all embodiments of the present disclosure.

Figure 1C:
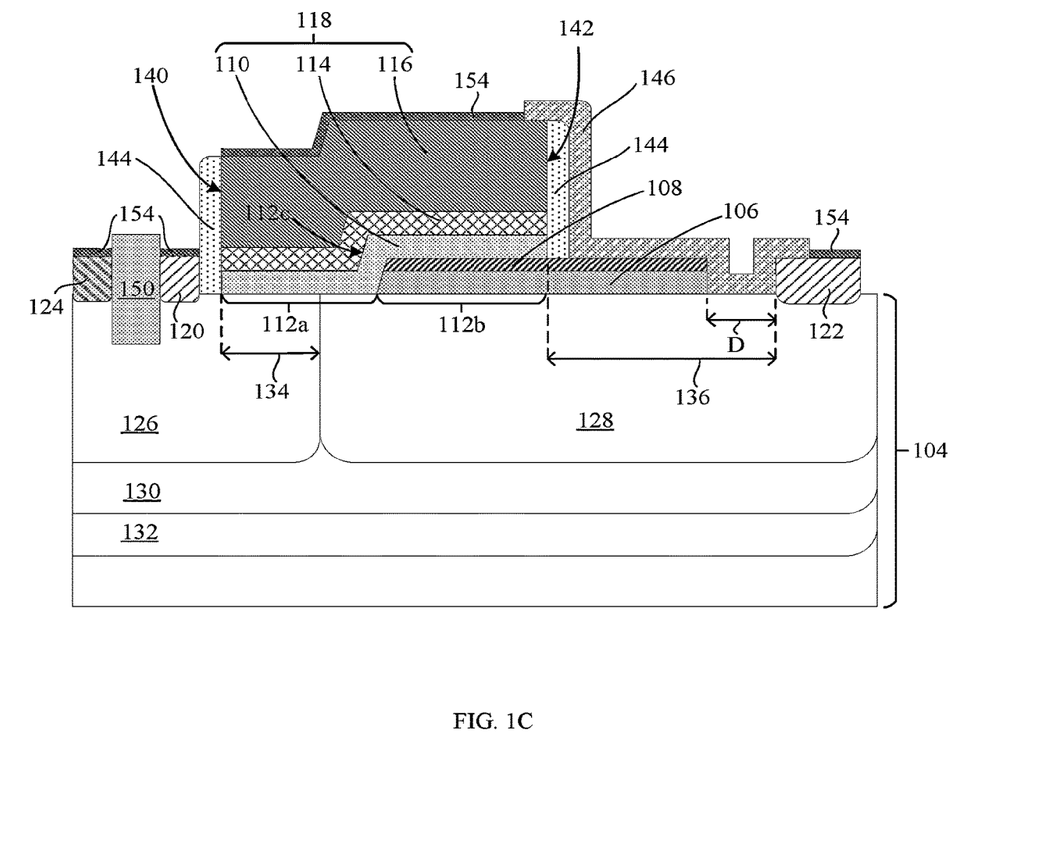

Referring to FIG. 1C, a cross-sectional view of another exemplary semiconductor device is shown. The embodiment shown in FIG. 1C is similar to the embodiment shown in FIG. 1A except that in FIG. 1C, both the insulating layer 106 and the semiconductor layer 108 extends laterally to cover the drain extension region 136. Additionally, the drain region 122 may be spaced apart from the insulating layer 106 and the semiconductor layer 108 by a predetermined distance D, which prevents an electrical short between the drain region 122 and the semiconductor layer 108. As shown, the nitride layer 146 on the gate spacer 144 may extend to cover the extended portion of the semiconductor layer 108, and also covering the predetermined distance D to provide additional electrical insulation between the drain region 122 and the semiconductor layer 108.

Figure 1D:
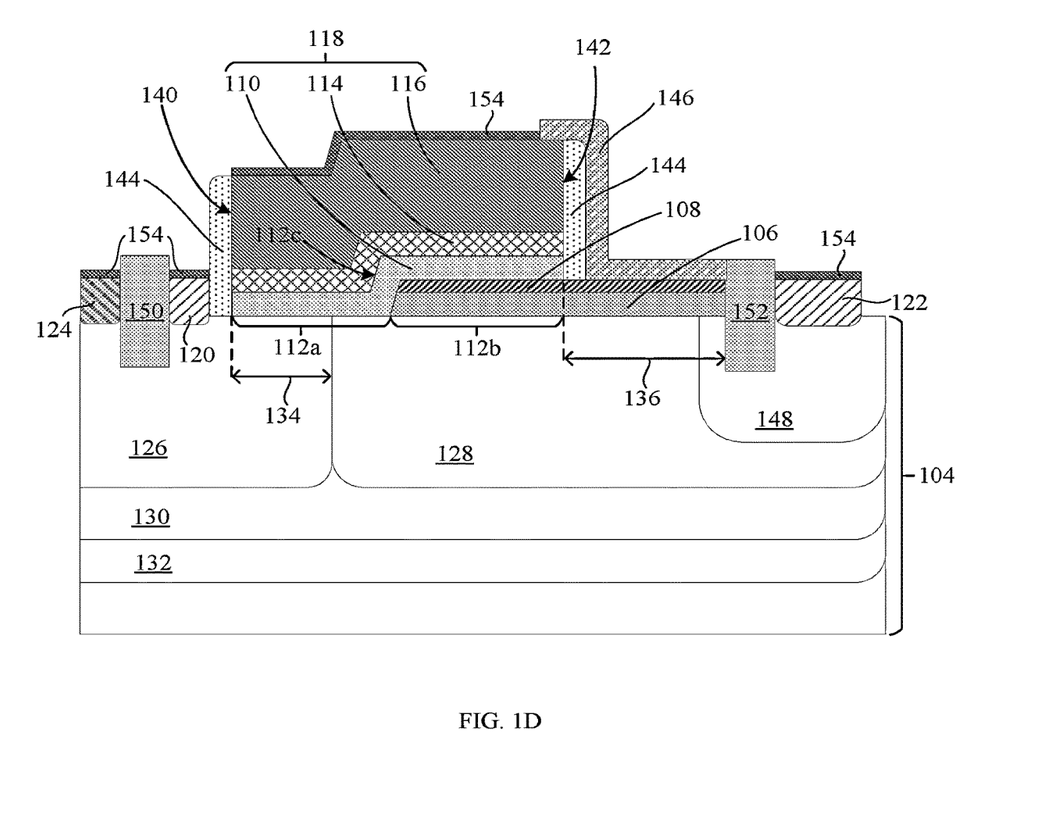

Referring to FIG. 1D, a cross-sectional view of another exemplary semiconductor device is shown. The embodiment shown in FIG. 1D is similar to the embodiment shown in FIG. 1A except that in FIG. 1D, both the insulating layer 106 and the semiconductor layer 108 extends laterally to cover the drain extension region 136. Additionally, the drain region 122 may be spaced apart from the insulating layer 106 and the semiconductor layer 108 by an isolation structure 152 in the bulk substrate 104. The isolation structure 152 may prevent an electrical short between the drain region 122 and the semiconductor layer 108. The isolation structure 152 may be formed by either performing a local oxidation of silicon (LOCOS), or by etching the bulk substrate 104 and depositing a dielectric material, such as silicon dioxide ($SiO_2$), tetraethyl orthosilicate (TEOS), in the etched area.

In some embodiments, a heavily doped region 148 may be formed in the drift well 128. The heavily doped region 148 may have the same conductivity type as that of the drift well 128, but has a higher dopant concentration than that of the drift well 128. The heavily doped region 148 may be directly below the drain region 122 and the isolation structure 152 to provide a greater concentration of electrical charges in the vicinity surrounding the drain region 122 and the isolation structure 152. In alternative embodiments (not shown), the heavily doped region 148 may not be present in the drift well 128.

As illustrated by the embodiments in FIGS. 1A to 1D, the semiconductor layer 108 may be electrically isolated by being surrounded by the insulating layer 106, the nitride layer 146 and the gate dielectric 110. The resistive properties of the gate dielectric 110 and the insulating layer 106 may enable the control of an electrical characteristic in the bulk substrate 104. For example, the gate 118 modulates the conductance of the electrical pathway between the source region 120 and the drain region 122.

In the representative embodiments, the second portion 112b of the gate dielectric 110, the semiconductor layer 108, and the insulating layer 106 are arranged between the gate electrode 116 and the drift well 128. Advantageously, this arrangement is found to create a larger distance of separation between the gate electrode 116 and the drift well 128, and reduces the electric field between the gate electrode 116 and the drift well 128. As a result, the arrangement may achieve an increased breakdown voltage (e.g., to sustain a large drain-to-source voltage during device operation), a reduced gate to drain capacitance, and/or improved performance reliability of the device.

Also shown in the representative embodiments, the first portion 112a of the gate dielectric 110 is arranged between the gate electrode 116 and the body well 126, and the body well 126 is not covered by the semiconductor layer 108 and the insulating layer 106. In particular, the channel region 134 may be uncovered by the semiconductor layer 108 and the insulating layer 106. The configuration of the body well 126 being uncovered by the semiconductor layer 108 and the insulating layer 106 may reduce the threshold voltage and the electrical power needed to create a conducting path between the source region 120 and the drain region 122.

More advantageously, by keeping the semiconductor layer 108 between the gate electrode 116 and the drift well 128, the devices of the present disclosure may be fabricated at a lower cost as compared to devices formed by conventional fabrication technologies. For example, the present disclosure can reduce manufacturing costs by avoiding the use of additional masks and their associated processes (e.g., etching and/or deposition steps).

Additionally, the presence of the drain extension region 136 may serve to reduce the electric field at the PN junction between the body well 126 and the drift well 128. The drain extension region 136 may also function as a Reduced Surface Field (RESURF) that increases the capability of the device to sustain high voltage operations.

FIGS. 2 through 7 show a set of steps that could be used to create the above structure, as provided for in an embodiment of the present disclosure.

As used herein, "deposition techniques" refer to the process of applying a material over another material (or the substrate). Exemplary techniques for deposition include, but not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), atomic layer deposition (ALD).

Additionally, "patterning techniques" includes deposition of material or photoresist, patterning, exposure, development, etching, cleaning, and/or removal of the material or photoresist as required in forming a described pattern, structure or opening. Examples of techniques for patterning include, but not limited to, wet etch lithographic processes, dry etch lithographic processes or direct patterning processes. Such techniques may use mask sets and mask layers.

The term "epitaxial growth" as used herein refers to the growth of a semiconductor material on a deposition surface of a same or different semiconductor material, in which the grown semiconductor material will have the same crystalline characteristics as the deposition surface of the semiconductor material.

Figure 2:
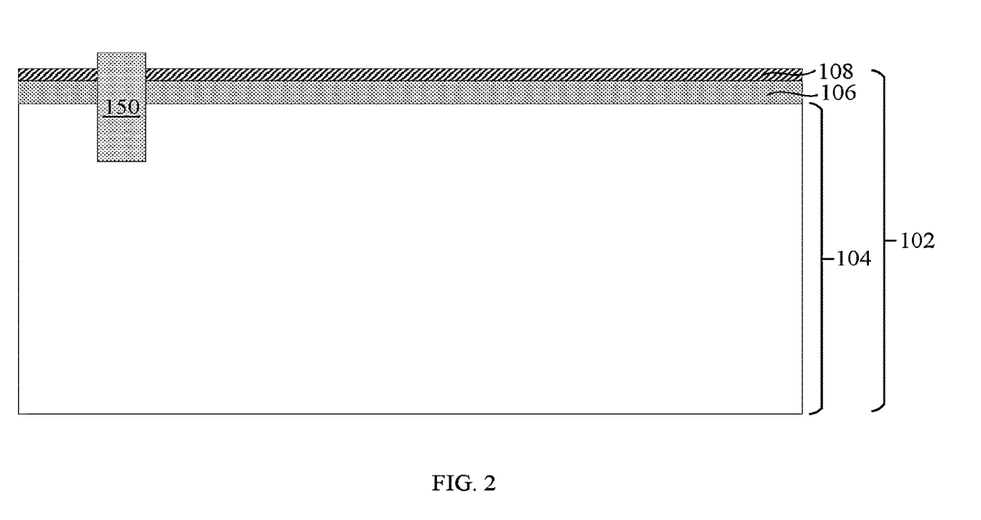
FIGS. 2 to 7 are cross-sectional views depicting various stages of forming a semiconductor device, in accordance with embodiments of the present disclosure.

FIG. 2 illustrates the provision of a semiconductor-on-insulator (SOI) substrate 102. The SOI substrate 102 includes a semiconductor layer 108, a bulk substrate 104 and an insulating layer 106. The insulating layer 106 is between the semiconductor layer 108 and the bulk substrate 104, and may be referred to as a "buried" insulating layer. An isolation structure 150 may be formed in the bulk substrate 104, in which the isolation structure 150 penetrates the semiconductor layer 108 and the insulating layer 106.

Figure 3:
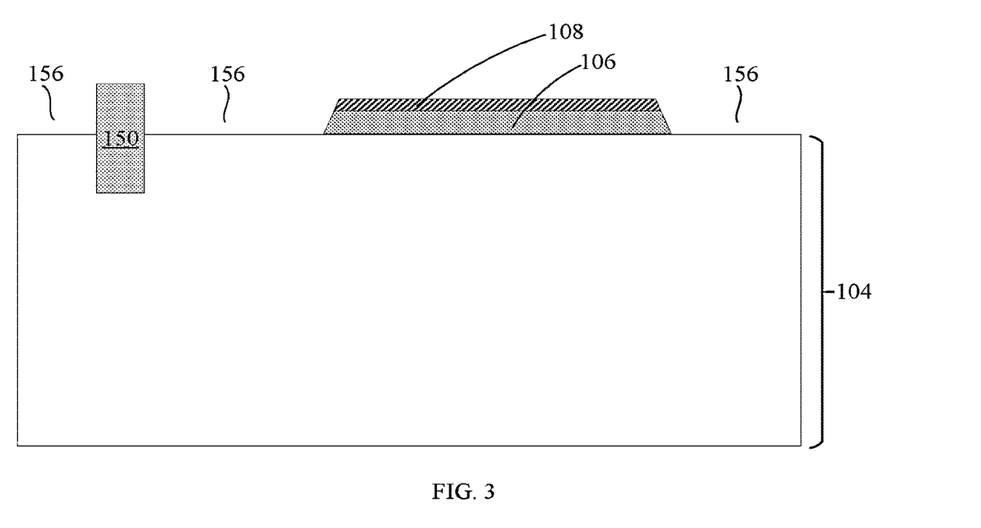

FIG. 3 illustrates the patterning of the insulating layer 106 and the semiconductor layer 108. The patterning of the insulating layer 106 and the semiconductor layer 108 exposes the underlying bulk substrate 104 and retains portions of the insulating layer 106 and the semiconductor layer 108 above the bulk substrate 104. In an embodiment, the patterning step removes portions of the insulating layer 106 and the semiconductor layer 108 to form openings 156 that expose the bulk substrate 104. In subsequent processing steps, source or drain regions may be formed on the exposed areas of the bulk substrate 104 through the openings 156. The patterning of the insulating layer 106 and the semiconductor layer 108 may be performed using the patterning techniques described herein.

Advantageously, the retaining of the semiconductor layer 108 is found to reduce the use of an additional mask or reticle to form a semiconductor device (e.g., a high-voltage device), thereby reducing overall manufacturing cost.

Figure 4:
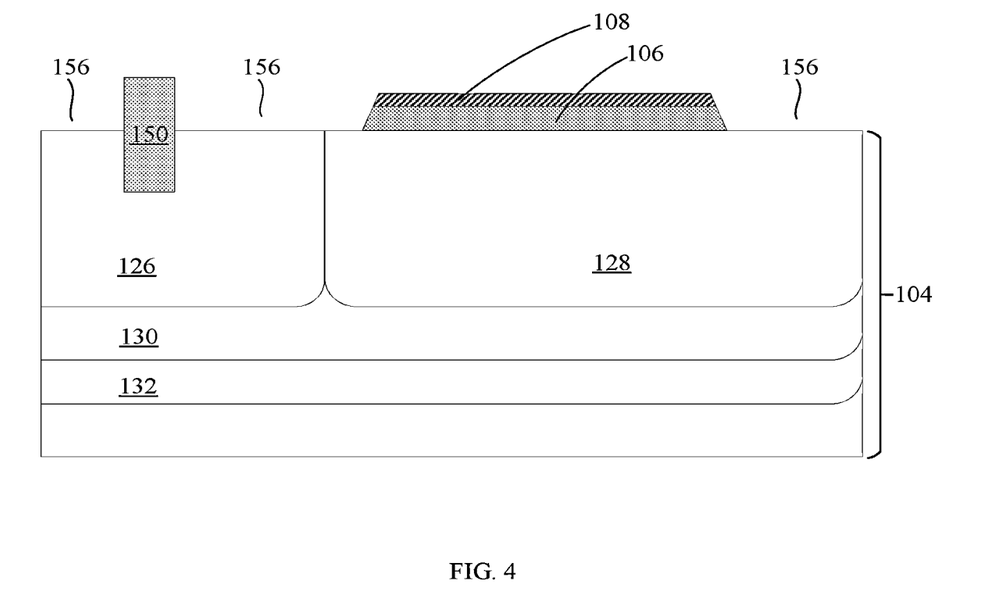

FIG. 4 illustrates the formation of the drift well 128 and the body well 126 in the bulk substrate 104. The bulk substrate 104 may be doped to form the drift well 128 and the body well 126, as well as the deep isolation wells 130, 132. In particular, the drift well 128 is formed below the retained portions of the semiconductor layer 108 and the insulating layer 106. To form the embodiment shown in FIG. 1D, a heavily doped region may be formed in the drift well 128 at this stage of the process.

As described above, the bulk substrate 104 may be doped to form various doped regions and doped wells. The doping process may be performed through the openings 156. Various doping techniques such as ion implantation with the use of a mask and a dopant of a conductivity type as described herein may be used. Additional steps of annealing may be performed to control the diffusion of the dopants within the bulk substrate 104.

Figure 5:
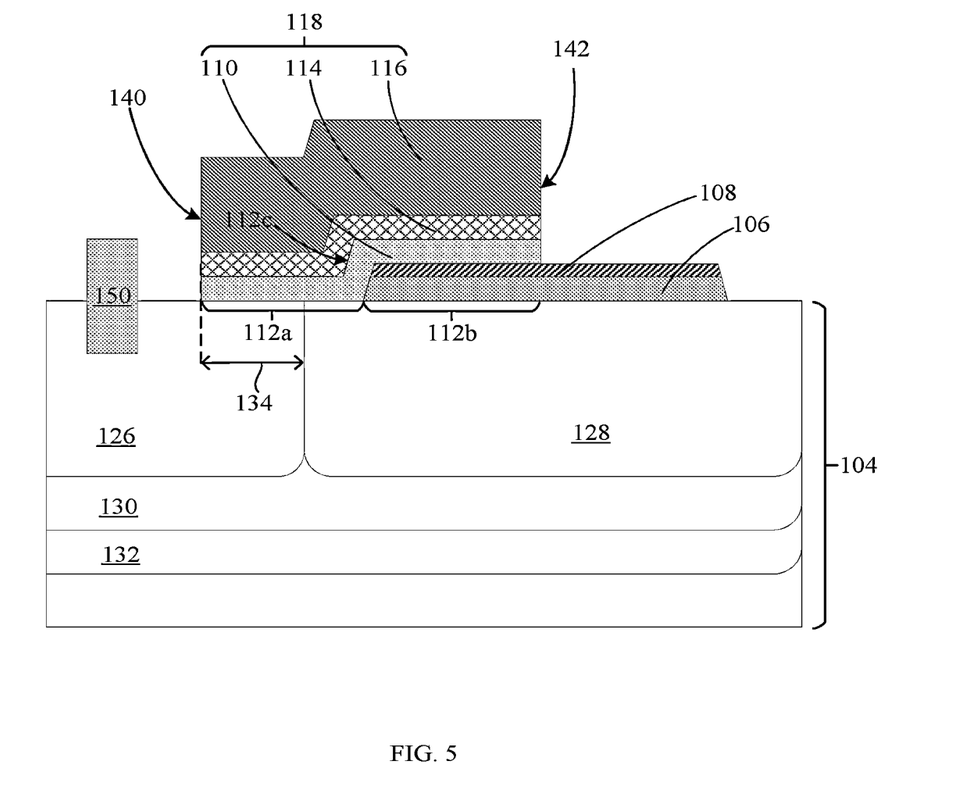

FIG. 5 illustrates the formation of the gate dielectric 110, the WFM layer 114, and the gate electrode 116. Formation of the gate dielectric 110, the WFM layer 114, and the gate electrode 116 may include several steps of deposition and patterning of layers of materials. As shown, the gate dielectric 110 may be formed with a first portion 112a on the exposed bulk substrate 104 and a second portion 112b on the retained portion of the semiconductor layer 108. Various deposition techniques may be used for the formation of the gate dielectric 110; however, a conformal deposition process (e.g., ALD or highly conformal CVD) may be preferred to form the gate dielectric 110. Thereafter, the WFM layer 114 and the gate electrode 116 may be deposited to conform with the topography of the gate dielectric 110.

Figure 6:
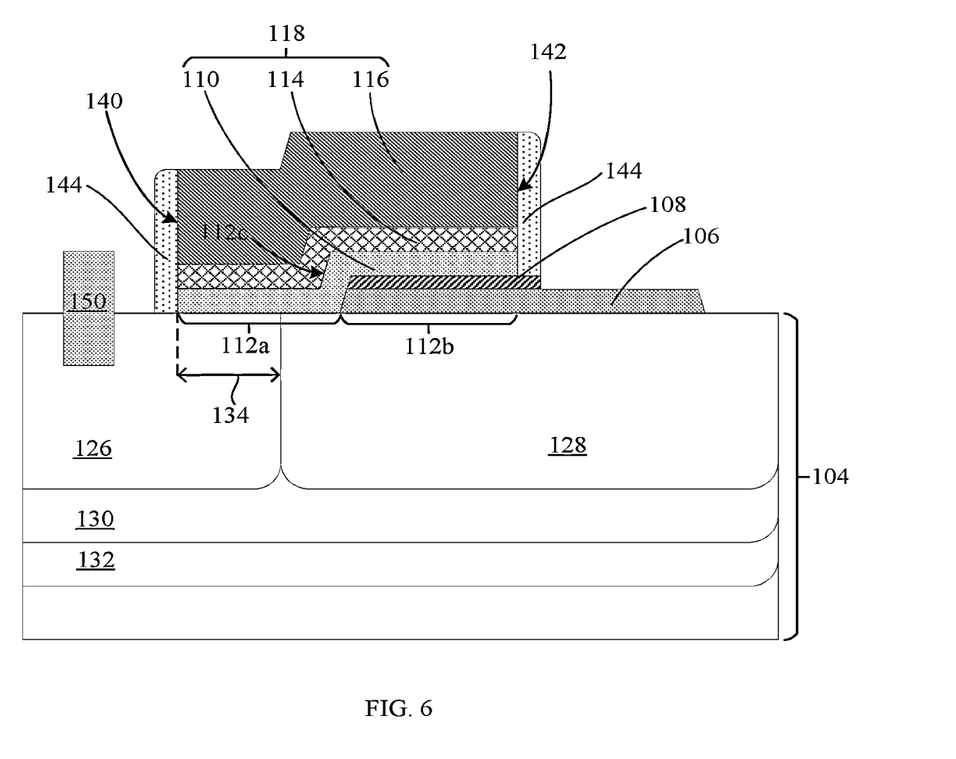

FIG. 6 illustrates the formation of gate spacers 144 on the drain-facing sidewall 142 and the source-facing sidewall 140 of the gate 118. The gate spacers 144 may be formed using various deposition techniques; however, it may be preferable to employ a conformal deposition process, such as ALD or a highly-conformal CVD process. A patterning process may be performed after the deposition to form the gate spacers 144. The gate spacers 144 may include a dielectric material, such as a nitride-containing compound, silicon nitride, or silicon nitride that is doped or enriched with elements such as, for example, boron, carbon, and oxygen (e.g., SiBCN or SiOCN). Although not shown in the accompanying drawings, a lightly-doped drain (LDD) implantation process may be performed after the formation of the gate spacer 144.

In the embodiment shown in FIG. 6, a portion of the semiconductor layer 108 that extends from the gate spacer 144 on the drain-facing sidewall 142 may be etched, thereby exposing the underlying insulating layer 106. Alternatively, to form the embodiments shown in FIG. 1C and FIG. 1D, the etching of the semiconductor layer 108 may be skipped.

Figure 7:
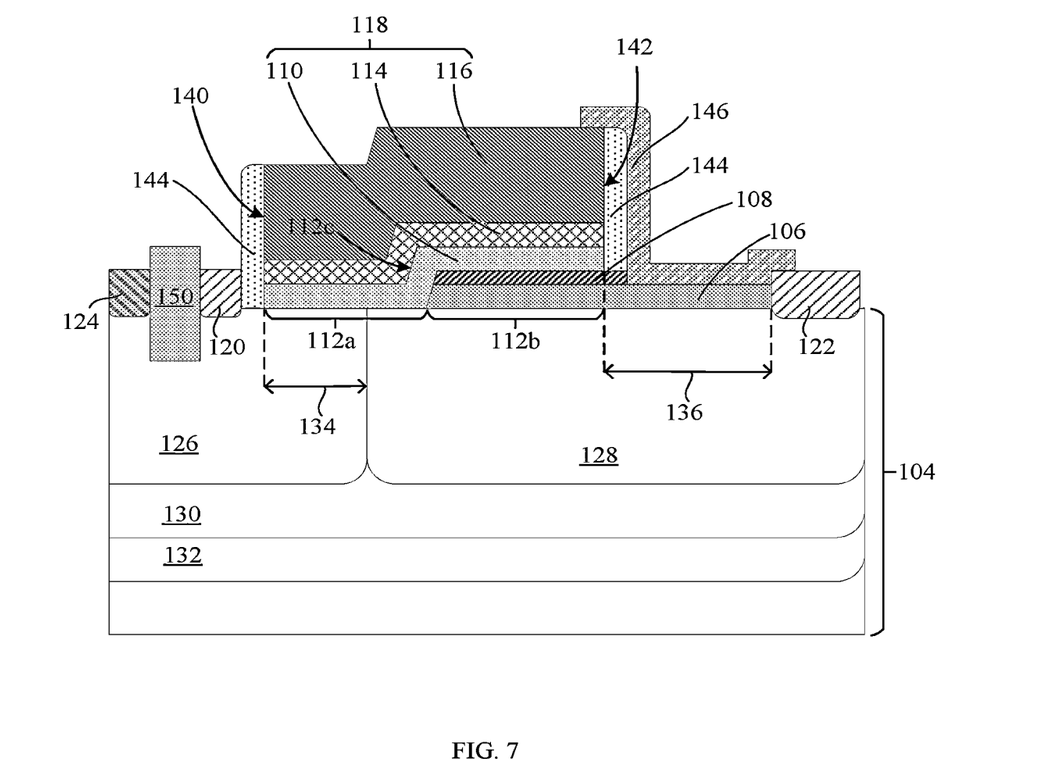

FIG. 7 illustrates the formation of the source region 120, the drain region 122, and the body region 124. The source region 120, the drain region 122, and the body region 124 may be formed on the exposed upper surface of the bulk substrate 104 using epitaxial growth of a semiconductor material with in-situ doping thereof. Alternatively, in some embodiments (not shown), the source region 120, the drain region 122, and the body region 124 may be formed by doping the exposed upper surface of the bulk substrate 104.

A nitride layer 146 may be deposited on the gate spacer 144 and the insulating layer 106. The nitride layer 146 may function as a mask layer for subsequent silicidation processing. To form the embodiments in FIG. 1A to 1D, silicide layers may be subsequently formed on the source region 120, the drain region 122, the body region 124, and the gate electrode 116.

Throughout this disclosure, the terms top, upper, upwards, over, and above refer to the direction away from the bulk substrate. Likewise, the terms bottom, lower, downwards, under, and below refer to the direction towards the bulk substrate. It is to be understood that the terms so used are interchangeable under appropriate circumstances such that the embodiments of the device described herein are, for example, capable of operation in other orientations than those illustrated or otherwise described herein.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description.

Additionally, the various tasks and processes described herein may be incorporated into a more comprehensive procedure or process having additional functionality not described in detail herein. In particular, various processes in the manufacture of integrated circuits are well-known and so, in the interest of brevity, many processes are only mentioned briefly herein or omitted entirely without providing the well-known process details.

As will be readily apparent to those skilled in the art upon a complete reading of the present application, the disclosed semiconductor devices and methods of forming the same may be employed in manufacturing a variety of different integrated circuit products, including, but not limited to, NV memory devices, CMOS devices, etc.

What is claimed is:

1. A semiconductor device comprising:
a bulk substrate;
a semiconductor layer above the bulk substrate;
an insulating layer between the semiconductor layer and the bulk substrate;
a source region and a drain region on the bulk substrate;
a gate having a drain-facing sidewall, the gate includes a gate electrode above a gate dielectric, the gate dielectric is between the source region and the drain region, the gate dielectric having a first portion on the bulk substrate and a second portion on the semiconductor layer;
a gate spacer directly on the drain-facing sidewall of the gate;
a drift well in the bulk substrate;
a drain extension region in the drift well, the drain extension region is located between the drain region and the gate electrode, wherein the insulating layer and the semiconductor layer have laterally extended portions that cover the drain extension region; and
a nitride layer on the gate spacer, the nitride layer is directly on and fully covers the extended portion of the semiconductor layer.

2. The semiconductor device of claim 1, further comprising a body well adjacent to the drift well in the bulk substrate, wherein the semiconductor layer and the insulating layer are positioned above the drift well.

3. The semiconductor device of claim 2, wherein the first portion of the gate dielectric is above the body well and the second portion of the gate dielectric is above the drift well.

4. The semiconductor device of claim 2, wherein the drain region is disposed upon an upper surface of the drift well.

5. The semiconductor device of claim 2, wherein the source region is disposed upon an upper surface of the body well.

6. The semiconductor device of claim 2, wherein the body well is spaced apart from the drift well by a gap spacing.

7. The semiconductor device of claim 2, wherein the body well abuts the drift well.

8. The semiconductor device of claim 2, wherein the drift well and the drain region are of the same conductivity type.

9. The semiconductor device of claim 2, wherein the drift well and the body well have opposite conductivity types with respect to each other.

10. The semiconductor device of claim 2, wherein the bulk substrate comprises an isolation well located below the body well and the drift well.

11. The semiconductor device of claim 1, wherein the drain region is spaced apart from the insulating layer and the semiconductor layer by a predetermined distance.

12. The semiconductor device of claim 1, further comprising an isolation structure in the bulk substrate, wherein the drain region is spaced apart from the insulating layer and the semiconductor layer by the isolation structure.

13. The semiconductor device of claim 1, wherein the semiconductor layer is electrically isolated by being surrounded by the insulating layer, the nitride layer, and the gate dielectric.

14. The semiconductor device of claim 1, wherein the source region and the drain region are raised above the upper surface of the bulk substrate.

15. The semiconductor device of claim 14, wherein the source region and the drain region include an epitaxial semiconductor material.

* * * * *